(12) United States Patent
Koo et al.

(10) Patent No.: US 8,624,124 B2
(45) Date of Patent: Jan. 7, 2014

(54) MULTILAYER STRETCHABLE CABLE (75) Inventors: Ja Myeong Koo, Suwon-si (KR); Soon Wan Chung, Seoul (KR); Soon Min Hong, Seoul (KR); Young Jun Moon, Hwaseong-si (KR)

(73) Assignee: Samsung Electronics Co., Ltd, Gyeonggi-Do (KR)

( * ) Notice: Subject to any disclaimer, the term of this patent is extended or adjusted under 35 U.S.C. 154(b) by 244 days.

(21) Appl. No.: 13/078,131

(22) Filed: Apr. 1, 2011

(65) Prior Publication Data
US 2011/0272181 A1 Nov. 10, 2011

(30) Foreign Application Priority Data

May 7, 2010 (KR) .................. 10-2010-0042787

(51) Int. Cl.
*H05K 1/02* (2006.01)
*H01B 7/08* (2006.01)
(52) U.S. Cl.
USPC ..................................... 174/254; 174/117 FF
(58) Field of Classification Search
USPC .................. 174/254, 117 F, 117 FF
See application file for complete search history.

(56) References Cited

U.S. PATENT DOCUMENTS

| | | | | |
|---|---|---|---|---|
| 3,764,727 A * | 10/1973 | Balde | ............................. | 174/34 |
| 4,520,562 A * | 6/1985 | Sado et al. | ..................... | 29/878 |
| 5,633,479 A * | 5/1997 | Hirano | .......................... | 174/255 |
| 6,096,978 A * | 8/2000 | Pohjola | ................... | 174/117 FF |
| 6,737,589 B2 * | 5/2004 | Adachi et al. | ................. | 174/254 |
| 6,927,343 B2 * | 8/2005 | Watanabe et al. | ............. | 174/254 |
| 7,265,298 B2 * | 9/2007 | Maghribi et al. | ............. | 174/254 |
| 8,138,421 B2 * | 3/2012 | Takamatsu et al. | ........ | 174/117 F |
| 2002/0189854 A1 * | 12/2002 | Crumly | ......................... | 174/254 |
| 2007/0151748 A1 * | 7/2007 | Ziegler et al. | ........... | 174/117 FF |

FOREIGN PATENT DOCUMENTS

KR  10-2000-0076886  12/2000

OTHER PUBLICATIONS

Office Action issued Aug. 10, 2011, in corresponding Korean Patent Application No. 10-2010-0042787.

* cited by examiner

*Primary Examiner* — Chau Nguyen
(74) *Attorney, Agent, or Firm* — Harness, Dickey & Pierce, P.L.C.

(57) ABSTRACT

According to an example embodiment, the multilayer stretchable cable includes a multilayer stretchable film and a plurality of conductive lines in the stretchable film. The conductive lines are in at least two different layers of the multilayer stretchable film in a thickness direction of the stretchable film, at least one conductive line is a signal line and at least one other conductive line in a layer adjacent to the signal line is a ground line. The signal line and the ground line are in zigzag patterns and are parallel to a width direction of the multilayer stretchable film.

12 Claims, 10 Drawing Sheets

MULTILAYER STRETCHABLE CABLE

CROSS-REFERENCE TO RELATED APPLICATION(S)

This application claims priority under 35 U.S.C. §119 to Korean Patent Application No. 2010-0042787, filed on May 7, 2010 in the Korean Intellectual Property Office, the entire disclosure of which is incorporated herein by reference.

BACKGROUND

1. Field

Example embodiments relate to a multilayer stretchable cable for minimizing electromagnetic interference of an electric signal and at the same time transmitting the resultant electric signal at high speed.

2. Description of the Related Art

Generally, a stretchable cable or circuit has flexibility as a result of having a flexible printed circuit (FPC) or flexible flat cable (FFC), and also has elasticity. If the stretchable cable or circuit is used for a hinge or driver that repeatedly moves, a structure of a product may be more simplified and a design time may be shortened. In addition, the stretchable cable or circuit can manufactured with relative ease, such that production costs thereof can be reduced.

In order to transmit an electric signal at high speed, a cable structure composed of a signal line and a ground line is desired. In order to minimize electromagnetic interference of an electric signal and transmit the resultant electric signal at high speed, a predetermined/desired distance between the signal line and the ground line should be maintained. However, if a conventional stretchable cable or circuit is used for a manufactured product that transmits an electric signal at high speed, a distance between the signal line and the ground line is changed when either the cable or circuit is stretched, such that electromagnetic interference occurs.

SUMMARY

According to an example embodiment, a multilayer stretchable cable includes a multilayer stretchable film and a plurality of conductive lines in the multilayer stretchable film. The conductive lines are in at least two different layers of the multilayer stretchable film in a thickness direction of the stretchable film, at least one conductive line is a signal line and at least one other conductive line in a layer adjacent to the signal line is a ground line. The signal line and the ground line are in zigzag patterns and are parallel to a width direction of the multilayer stretchable film.

According to an example embodiment, the signal line and the ground line are mapped to each other on a one-to-one basis. The zigzag patterns of the signal and ground lines cross each other.

According to an example embodiment, the signal lines on a same layer are parallel to each other in a width direction of the stretchable cable and are spaced apart from each other at a desired distance. A pitch between the signal line and the ground line on different layers is 5 mm or less.

According to an example embodiment, the ground line is on upper and lower layers of the signal line.

According to an example embodiment, a shield plane is on an upper layer of the signal line and on a lower layer of the ground line.

According to an example embodiment, the shield plane has a beehive-shaped mesh structure in which thin lines are repeatedly entwined with each other.

According to an example embodiment, a multilayer stretchable cable includes a multilayer stretchable film, a plurality of conductive lines in the multilayer stretchable film and at least one ground plane in the multilayer stretchable film. The conductive lines and the ground plane are in at least two different layers in a thickness direction of the stretchable film. The conductive lines include signal lines in zigzag patterns and the conductive lines are parallel to a width direction of the stretchable film. The ground plane has a mesh structure.

According to an example embodiment, the mesh structure of the ground plane has a beehive-shaped mesh structure in which thin lines are repeatedly entwined with each other.

According to an example embodiment, the signal lines on a same layer are parallel to a width direction of the multilayer stretchable cable and are spaced apart from each other at a desired distance. A pitch between the signal line and the ground plane on different layers is 5 mm or less.

According to an example embodiment, the ground line is on upper and lower layers of the signal line.

According to an example embodiment, a shield plane is on an upper layer of the signal line and on a lower layer of the ground line.

According to an example embodiment, the shield plane has a beehive-shaped mesh structure in which thin lines are repeatedly entwined with each other.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These tennis are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Figure 1A:
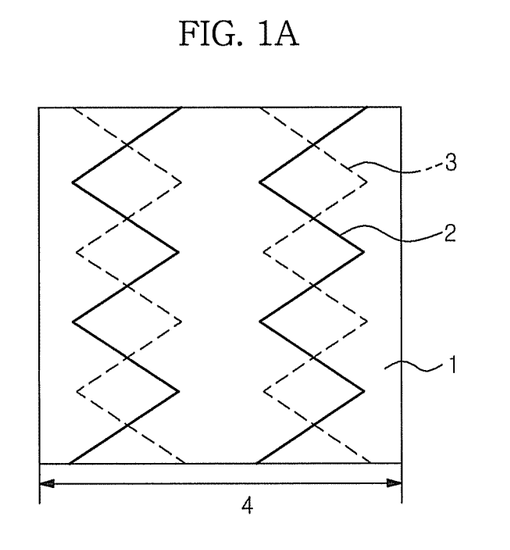
FIGS. 1A and 1B are plan views illustrating a multilayer stretchable cable according to an example embodiment.
Figure 1B:
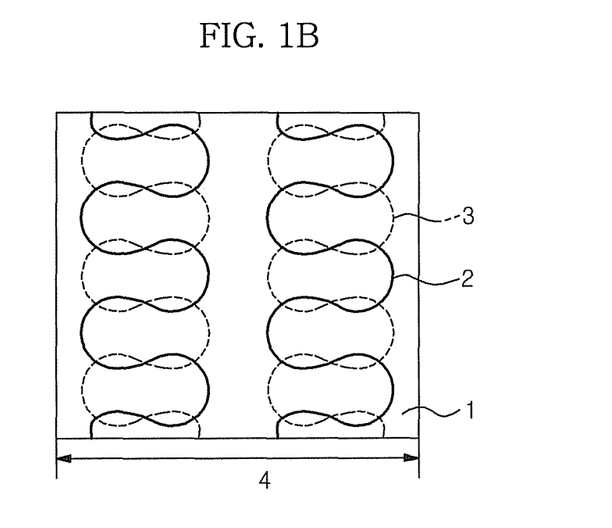

FIGS. 1A and 1B are plan views illustrating a multilayer stretchable cable according to an example embodiment.

Referring to FIGS. 1A and 1B, a stretchable cable is divided into two layers. The stretchable cable may include a plurality of conductive lines 2, 3 arranged at each of the two layers, and a stretchable film 1 serving as an insulator covering the conductive lines. Referring to FIG. 1A, the conductive lines 2, 3 are curved in a zigzag manner, and are arranged parallel to a cable-width direction 4 on each layer. Referring to FIG. 1B, the conductive lines 2, 3 are curved in a manner that the zigzagged shape is repeated in a horseshoe-shaped fat mat, such that the conductive lines can be arranged parallel to a cable-width direction 4 on each layer.

When the stretchable film 1 is stretched by external stress, the zigzagged arrangement or the horseshoe-shaped arrangement may be stretched with the stretchable film 1. The zigzagged patterns are not limited only to a triangular- or horseshoe-shaped pattern, and may also include any zigzag pattern as required by design.

Each conductive line has a relatively thin thickness and/or a relatively small diameter (about 0.01~5 mm), and both ends thereof may be connected to a predetermined/desired connector, or may be directly connected to a terminal of a circuit board.

The conductive line may be comprised of a conductive metal wire, or may also be comprised of a conductive yarn or a bundle of twisted conductive yarns. In order to form the conductive yarn, a conductive metal (such as copper, silver, gold, white gold, iron or nickel) is coated on the surface of a core such as a non-conductive fiber or a polymer thread.

In addition, the conductive line may prevent the short-circuiting of a conductive line using a conductive metal wire enclosed with a non-conductive material.

The conductive line may be fanned by winding a conductive metal wire on the surface of a stretchable core. The core may be comprised of a non-conductive material, such as silicon, polyurethane (PU), synthetic rubber, or the like.

In this case, a conductive line is prevented from being short-circuited when the stretchable cable is manufactured or stretched.

The stretchable film 1 includes an upper film and a lower film, each of which is formed of a thin-film stretchable polymer, a thin-film stretchable rubber, or a combination thereof. The upper film and the lower film cover zigzagged or U-shaped conductive lines that are arranged in parallel to one another. Polyurethane (PU) may be used as stretchable polymer.

Among conductive lines that are divided into two layers and arranged on each layer, a conductive line arranged at an upper layer may be used as a signal line 2, a conductive line arranged at a lower layer may be used as a ground line 3. Needless to say, the positions of the signal line 2 and the ground line 3 may be exchanged with each other.

The structure that uses the signal line 2 and the ground line 3 is generally used to transmit an electric signal at high speed.

In order to minimize electromagnetic interference of the electric signal and transmit the resultant electric signal at high speed, it is necessary for the signal line 2 and the ground line 3 to be spaced apart from each other at a predetermined/desired distance, and the predetermined/desired distance may be fixed. In addition, the average distance from a noise generation source to the ground line 3 must be identical to that from the noise generation source to the signal line 2. During the transmission of an electric signal, if the distance from the noise generation source to the signal line 2 or the ground line 3 changes, impedance also changes. If the average distance from the noise generation source to the ground line 3 is different from that from the noise generation source to the signal line 2, a difference in signal distortion occurs while noise is applied, such that electromagnetic interference occurs.

A group of components or products that must accommodate stretching, twisting, and folding caused by external stress is desired to use a flexible or stretchable cable. At the same time, if high-speed transmission of the electric signal is desired, the distance between the signal line 2 and the ground line 3 may be constant, and it is necessary to use a cable in which the average distance from the noise generation source to the signal line 2 is almost identical to that of the noise generation source to the ground line 3.

Conventionally, in order to allow a cable to be freely stretched in response to external stress and at the same time transmit an electric signal at high speed, the signal line and the ground line are zigzagged and arranged on a single layer, and a stretchable cable that covers the signal line and the ground line with an insulator is used.

The signal line and the ground line are zigzagged such that they can be freely stretched in response to external stress. However, when the cable is stretched, the distance from the signal line and the ground line that are arranged on a single layer is changed, such that impedance is also changed.

In case of a single-layered cable in which the signal line and the ground line are arranged in parallel to each other on the same layer, when noise is received from an external part, an average distance from the noise generation source to the signal line is different from an average distance from the noise generation source to the ground line, such that a difference in signal distortion occurs between the signal line and the ground line because of noise. As a result, it is difficult to minimize electromagnetic interference of the electric signal and at the same time transmit the resultant electric signal at high speed.

Example embodiments shown in FIGS. 1A and 1B provide a stretchable cable structure that is capable of solving the problem of a conventional stretchable cable structure.

The signal line 2 arranged on an upper layer is one-to-one matched to the ground line 3 arranged on a lower layer. The zigzag format of the signal line 2 located on the upper layer may cross with the ground line 3 located on the lower layer (See FIGS. 1A and 1B).

If the signal line 2 and the ground line are arranged in different layers, the distance between the signal line 2 and the ground line 3 can be constantly maintained even when the cable is stretched. As a result, the impedance change caused by a variation of the difference between the signal line 2 and the ground line 3 can be reduced.

In addition, if the signal line 2 and the ground line 3 are arranged on different layers in a manner that the signal line 2 and the ground line 3 are matched on a one-to-one basis, the average distance from the noise generation source to the signal line 2 may be identical to that from the noise generation source to the ground line 3 while noise is present, differently from the conventional structure in which the signal line and the ground line are arranged in parallel on a single layer. As a result, when noise is present, there is minimal difference in signal distortion between the signal line 2 and the ground line 3.

If zigzagged formats of the signal line 2 and the ground line 3 are crossed with each other on different layers, electromagnetic interference can be minimized as in a twisted pair cable in which electric wires are twisted.

Therefore, the stretchable cable may be stretched, may minimize electromagnetic interference of the electric signal, and may transmit the resultant electric signal at high speed.

Figure 1C:
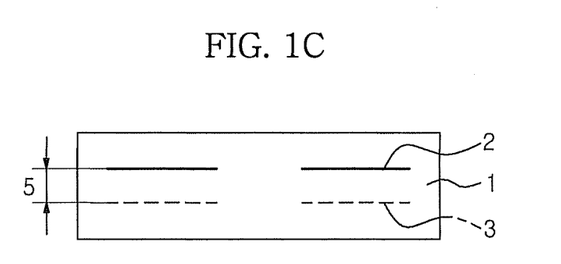
FIG. 1C is a cross-sectional view illustrating a multilayer stretchable cable according to an example embodiment.

FIG. 1C is a cross-sectional view illustrating a multilayer stretchable cable shown in FIG. 1A or 1B. Referring to FIG. 1C, the multilayer stretchable cable structure can be understood. A signal line 2 is arranged at an upper layer, and a ground line 3 is arranged at a lower layer, and the signal line 2 and the ground line 3 can be mapped to each other on one-to-one basis.

A pitch between the signal line and the ground line 3 may be set to 5 mm or less. If necessary, the pitch can be reduced to 0.05 mm or less in response to a thickness of the stretchable film 1. If the pitch 5 is set to a low value, a difference between an average distance from a noise generation source to the signal line 2 and an average distance from the noise generation source to the ground line 3 may be further reduced when noise is applied. Therefore, the occurrence of a difference in signal distortion between the signal line 2 and the ground line 3 can be prevented.

Although FIGS. 1A to 1C illustrate a double-layered stretchable cable, it should be noted that the number of layers may not be limited thereto and example embodiments may be extended to cables having more than two layers.

Figure 1D:
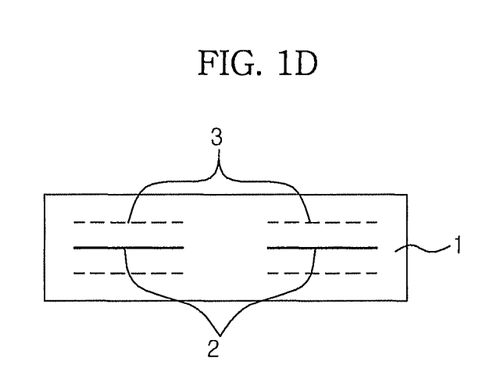
FIGS. 1D and 1E are plan views illustrating a modified structure of a multilayer stretchable cable according to an example embodiment.
Figure 1E:
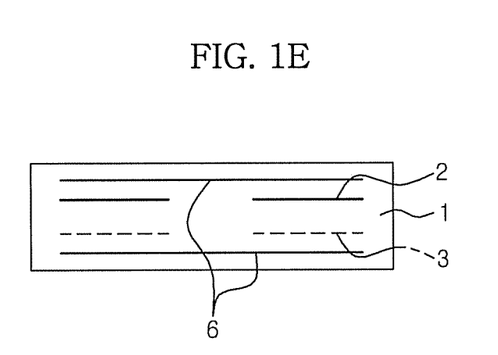

FIGS. 1D and 1E are plan views illustrating a modified structure of a multilayer stretchable cable according to an example embodiment.

FIG. 1D is a plan view illustrating a modified multilayer stretchable cable in which the ground line 3 is arranged at upper and lower layers of the signal line 2 using the signal line 2 as a reference line. FIG. 1E is a plan view illustrating another multilayer stretchable cable in which a shield plane 6 is arranged at each of the upper layer of the signal line 2 and the lower layer of the ground line 3. The shield plane 6 may have a beehive-shaped mesh structure in which thin lines are repeatedly entwined with each other to give elasticity to the cable. The shield plane 6 is arranged at each of the upper and lower layers of the signal line 2 and the ground line 3, such that an external electromagnetic interference may be efficiently shielded.

Figure 2A:
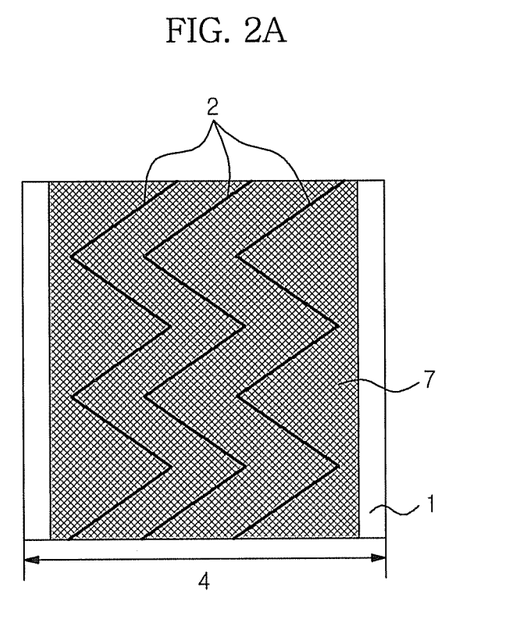
FIGS. 2A and 2B are plan views illustrating a multilayer stretchable cable according to another example embodiment.
Figure 2B:
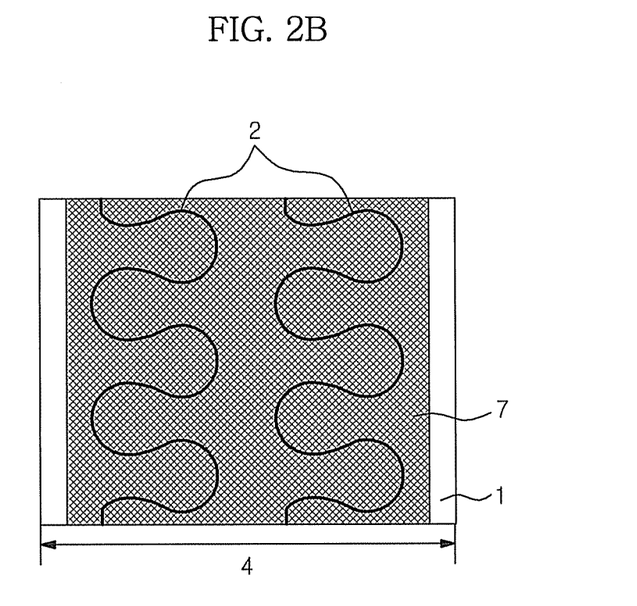

FIGS. 2A and 2B are plan views illustrating a multilayer stretchable cable according to another example embodiment.

Referring to FIGS. 2A and 2B, a stretchable cable may include a stretchable film 1 that is divided into two layers. The stretchable film 1 may include a plurality of signal lines 2 arranged at one of the two layers, a ground plane 7 arranged at an upper or lower layer of the layer on which the signal lines 2 are arranged, and a stretchable film 1 covering the signal lines and the ground plane 7. Referring to FIG. 2A, the signal lines are curved in a zigzag manner, and are arranged in parallel to a cable-width direction 4 on each layer. Referring to FIG. 2B, the signal lines are curved in a manner that the zigzagged shape is repeated in a horseshoe-shaped for mat, such that the signal lines can be arranged in parallel to a cable-width direction 4 on each layer. When the stretchable film 1 is stretched/compressed by external forces, the zigzagged arrangement or the horseshoe-shaped arrangement may also be stretched/compressed with the stretchable film 1. The zigzagged patterns are not limited only to a triangular- or horseshoe-shaped pattern, and a variety of patterns may be used as per design requirements. The ground plane 7 may have a beehive-shaped mesh structure in which thin lines are repeatedly entwined with each other.

In accordance with a conventional stretchable cable, in the case of using the ground plane instead of the ground line so as to transmit an electric signal at high speed, a signal line is curved in a zigzag manner and is arranged in parallel to a cable-width direction, the ground plane is arranged at a lower layer of the signal line, and a stretchable film formed of an insulator covers the signal line and the ground plane.

The ground plane for use in the above-mentioned conventional stretchable cable may be fowled of conductive metal that does not have flexibility and elasticity, such that it is difficult to give elasticity to the above ground plane.

As a result, it is difficult for the conventional stretchable cable to be freely stretched in response to external stress and to transmit an electric signal at high speed.

Example embodiments shown in FIG. 2A or 2B provide a stretchable cable capable of obviating the problems of the conventional stretchable cable that uses the ground plane 7.

The ground plane 7 located at an upper or lower layer of the signal line 2 may have a beehive-shaped mesh structure in which thin lines are repeatedly entwined with each other. The mesh structure of the ground plane 7 can also be stretched with the stretchable film 1 in the same manner as in the signal line 2.

Therefore, the stretchable cable according to example embodiments can be freely stretched in response to external stress and transmit the electric signal at high speed. Other than the location and usage of the ground plane 7, the remaining characteristics of the stretchable cable of FIG. 2A or 2B are identical to those of example embodiments that use the signal line 2 and the ground line 3 as shown in FIGS. 1A and 1B.

Figure 2C:
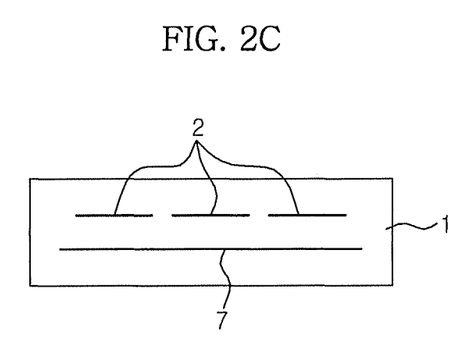
FIG. 2C is a cross-sectional view illustrating a multilayer stretchable cable according to another example embodiment.

FIG. 2C is a cross-sectional view illustrating a multilayer stretchable cable according to another example embodiment.

As shown in FIG. 2C, a signal line 2 may be located at an upper layer, and a ground plane 7 may be located at a lower layer.

A pitch between the signal line 2 and the ground plane 7 may be set to 5 mm or less. The pitch may be reduced to 0.05 mm or less in response to a thickness of the stretchable film 1. If the pitch is set to a low value, a difference between an average distance from the noise generation source to the signal line 2 and an average distance from the noise generation source to the ground plane 7 may be further reduced when noise is applied. Therefore, the occurrence of a difference in signal distortion between the signal line 2 and the ground plane 7 can be prevented.

Although FIGS. 2A to 2C illustrate a double-layered stretchable cable, it should be noted that example embodiments are not limited thereto, and the number of layers may be more than two.

Figure 2D:
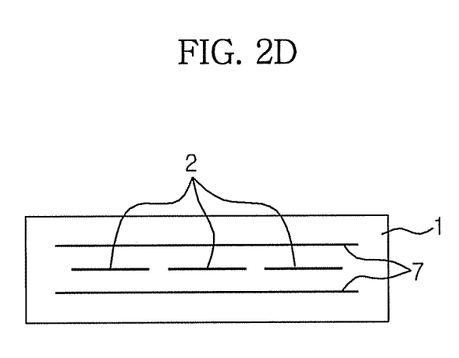
FIGS. 2D and 2E are cross-sectional views illustrating a modified structure of a multilayer stretchable cable according to another example embodiment.
Figure 2E:
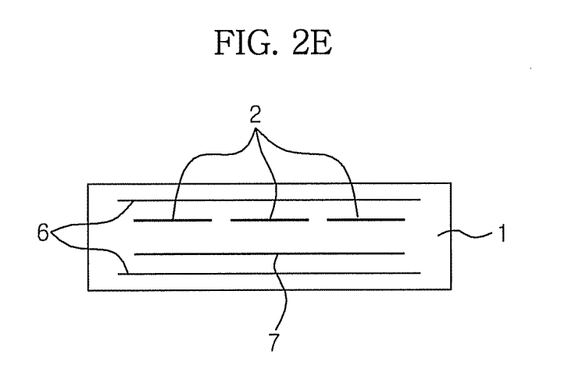

FIGS. 2D and 2E are cross-sectional views illustrating a structure of a multilayer stretchable cable according to another example embodiment.

FIG. 2D is a plan view illustrating a multilayer stretchable cable in which the ground plane 7 is arranged at upper and lower layers of the signal line 2 using the signal line 2 as a reference line. FIG. 2E is a plan view illustrating another multilayer stretchable cable in which a shield plane 6 is arranged at each of the upper layer of the signal line 2 and the lower layer of the ground plane 7. The shield plane 6 may have a beehive-shaped mesh structure in which thin lines are repeatedly entwined with each other to give elasticity to the cable. The shield plane 6 is arranged at each of the upper and lower layers of the signal line 2 and the ground plane 7, such that an external electromagnetic interference can be more effectively shielded.

As is understood from the above description, the multilayer stretchable cable according to example embodiments allows an average distance between a signal line and a ground line to be constant, such that an external electromagnetic interference can be minimized and at the same time an electric signal can be transmitted at high speed.

In addition, the multilayer stretchable cable according to example embodiments can be curved such that the curved multilayer stretchable cable can be used without any modification, resulting in flexibility in circuit design.

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A multilayer stretchable cable comprising:
   a multilayer stretchable film having at least two different layers in a thickness direction of the multilayer stretchable film; and
   a plurality of conductive lines in the multilayer stretchable film, the plurality of conductive lines including signal lines and ground lines, wherein
   the signal lines are in at least one layer of the multilayer stretchable film and the ground lines are in at least one other layer of the multilayer stretchable film, the one other layer being adjacent to the at least one layer,
   the signal lines and the ground lines are in zigzag patterns and are parallel to a width direction of the multilayer stretchable film,
   the signal lines and the ground lines are mapped to each other on a one-to-one basis, and
   the zigzag patterns of the signal and ground lines cross each other.

2. The multilayer stretchable cable according to claim 1, wherein
   the signal lines on any one layer of the multilayer stretchable film are parallel to each other in a width direction of the multilayer stretchable cable and are spaced apart from each other at a desired distance, and
   a pitch between the signal lines and the ground lines on any two adjacent layers is 5 mm or less.

3. The multilayer stretchable cable according to claim 1, wherein the ground lines are on above and below layers of the at least one layer in the thickness direction of the multilayer stretchable film.

4. The multilayer stretchable cable according to claim 1, wherein a shield plane encloses the signal lines and the ground lines in the thickness direction of the multilayer stretchable film.

5. The multilayer stretchable cable according to claim 4, wherein the shield plane has a beehive-shaped mesh structure in which thin lines are repeatedly entwined with each other.

6. The multilayer stretchable cable according to claim 1, wherein the multilayer stretchable film is entirely stretchable.

7. The multilayer stretchable cable according to claim 1, wherein the at least two different layers of the multilayer stretchable film are formed of a stretchable insulator film, the stretchable insulator film including at least one of a stretchable polymer and a stretchable rubber.

8. A multilayer stretchable cable comprising:
   a multilayer stretchable film having at least two different layers in a thickness direction of the multilayer stretchable film;
   a plurality of conductive lines in the multilayer stretchable film, the plurality of conductive lines including signal lines; and
   at least one ground plane in the multilayer stretchable film, wherein
   the signal lines are in at least one layer of the multilayer stretchable film and the ground plane is in at least one other layer of the multilayer stretchable film, the one other layer being adjacent to the at least one layer,
   the signal lines are in zigzag patterns, the signal lines being parallel to each other in a width direction of the multilayer stretchable film, and the ground plane having a mesh structure, and
   a shield plane encloses the signal lines and the ground plane in the thickness direction of the multilayer stretchable film.

9. The multilayer stretchable cable according to claim 8, wherein the mesh structure of the ground plane has a beehive-shaped mesh structure in which thin lines are repeatedly entwined with each other.

10. The multilayer stretchable cable according to claim 8, wherein
    the signal lines on any one layer of the multilayer stretchable film are parallel to each other in a width direction of the multilayer stretchable cable and are spaced apart from each other at a desired distance, and
    a pitch between the signal lines and the ground plane on any two adjacent layers is 5 mm or less.

11. The multilayer stretchable cable according to claim 8, wherein the ground plane is on above and below layers of the at least one layer in the thickness direction of the multilayer stretchable film.

12. The multilayer stretchable cable according to claim 8, wherein the shield plane has a beehive-shaped mesh structure in which thin lines are repeatedly entwined with each other.

* * * * *